(12) United States Patent
Hikichi et al.

(10) Patent No.: US 10,191,124 B2
(45) Date of Patent: Jan. 29, 2019

(54) SENSOR CIRCUIT

(71) Applicant: SII Semiconductor Corporation, Chiba-shi, Chiba (JP)

(72) Inventors: Tomoki Hikichi, Chiba (JP); Minoru Ariyama, Chiba (JP); Hironori Yano, Chiba (JP)

(73) Assignee: SII Semiconductor Corporation, Chiba-Shi (JP)

( * ) Notice: Subject to any disclaimer, the term of this patent is extended or adjusted under 35 U.S.C. 154(b) by 0 days.

(21) Appl. No.: 15/685,473

(22) Filed: Aug. 24, 2017

(65) Prior Publication Data

US 2018/0059193 A1 Mar. 1, 2018

(30) Foreign Application Priority Data

Aug. 26, 2016 (JP) .................... 2016-165827
Jul. 6, 2017 (JP) .................... 2017-132422

(51) Int. Cl.
*G01R 33/00* (2006.01)
(52) U.S. Cl.
CPC ..... *G01R 33/0029* (2013.01); *G01R 33/0005* (2013.01); *G01R 33/0017* (2013.01)
(58) Field of Classification Search
CPC . G01R 33/0005; G01R 33/00; G01R 33/0017
See application file for complete search history.

(56) References Cited

U.S. PATENT DOCUMENTS

| 2008/0103705 | A1* | 5/2008 | Hammerschmidt | ... G08C 25/00 702/57 |
| 2009/0033324 | A1 | 2/2009 | Tomida et al. | |
| 2012/0218005 | A1* | 8/2012 | Chua-Eoan | ............... G06F 1/26 327/107 |
| 2016/0266199 | A1* | 9/2016 | Kurosawa | ........ G01R 31/31724 |

FOREIGN PATENT DOCUMENTS

JP 2009-031225 A 2/2009

* cited by examiner

*Primary Examiner* — Jermele M Hollington
*Assistant Examiner* — Alvaro Fortich
(74) *Attorney, Agent, or Firm* — Brinks Gilson & Lione

(57) ABSTRACT

Provided is a sensor circuit that has little possibility of being accidentally put into a test mode in response to an external input of noise or the like. The sensor circuit includes a clock generation circuit configured to output a control signal that is used to control intermittent operation to a physical quantity detection unit, and to output a sampling signal in a sleep period, a potential detection circuit configured to detect a potential at an output terminal and to output a detection signal, and a clock control circuit configured to output a mode switching signal that is a command to switch the clock generation circuit to a test mode, when a given signal pattern is detected in data that is obtained by sampling the detection signal based on the sampling signal.

5 Claims, 8 Drawing Sheets

SENSOR CIRCUIT

RELATED APPLICATIONS

This application claims priority under 35 U.S.C. § 119 to Japanese Patent Applications No. 2016-165827 filed on Aug. 26, 2016 and No. 2017-132422 filed on Jul. 6, 2017, the entire content of which are hereby incorporated by reference.

BACKGROUND OF THE INVENTION

1. Field of the Invention

The present invention relates to a sensor circuit, in particular, to a sensor circuit having a test circuit.

2. Description of the Related Art

Hitherto, sensor circuits configured to detect various physical quantities have been mounted and utilized in electronic equipment. A sensor circuit is set in a three-terminal package that has a supply terminal, a ground terminal, and an output terminal. A sensor circuit that is set in a package having this small number of terminals cannot have a dedicated terminal for switching to a test mode in many cases. For that reason, in the sensor circuit having a small number of terminals, the output terminal also serves as a test terminal.

A sensor circuit of the related art includes a first inversion unit, configured to output the potential level of an output signal from a detection unit, a second inversion unit, configured to invert the potential level of the output signal from the detection unit and to output the resultant signal to an output terminal, and a mode switching circuit, configured to switch to a test mode depending on the potential level at the first inversion unit and the potential level at the second inversion unit. A voltage is forcedly input from the output terminal, thereby causing the mode switching circuit to detect a potential state of same potential that does not normally happen and to switch to the test mode (see Japanese Patent Application Laid-open No. 2009-31225, for example).

With the magnetic sensor circuit of Japanese Patent Application Laid-open No. 2009-31225, however, there is a risk in that a switch to the test mode is executed accidentally in response to an unintended external input of superimposed noise or the like from the output terminal. The unintended switch to the test mode can happen also when the load capacity of the output terminal is large due to a delay in changing the normal potential level at the output terminal depending on the result of the detection.

SUMMARY OF THE INVENTION

According to one embodiment of the present invention, there is provided a sensor circuit including: a clock generation circuit configured to output a control signal that is used to control intermittent operation to a physical quantity detection unit and to output a sampling signal in a sleep period; a potential detection circuit configured to detect a potential at an output terminal and to output a detection signal; and a clock control circuit configured to output a mode switching signal that is a command to switch the clock generation circuit to a test mode when a given signal pattern is detected in data that is obtained by sampling the detection signal based on the sampling signal.

According to the sensor circuit of the present invention, the risk of accidentally switching to the test mode is small and stable operation is accomplished.

DETAILED DESCRIPTION OF THE PREFERRED EMBODIMENTS

A sensor circuit according to the present invention is described below by taking as an example a magnetic switch from which binary output is made as the result of comparison between an output voltage of a Hall element and a reference voltage.

First Embodiment

Figure 1:
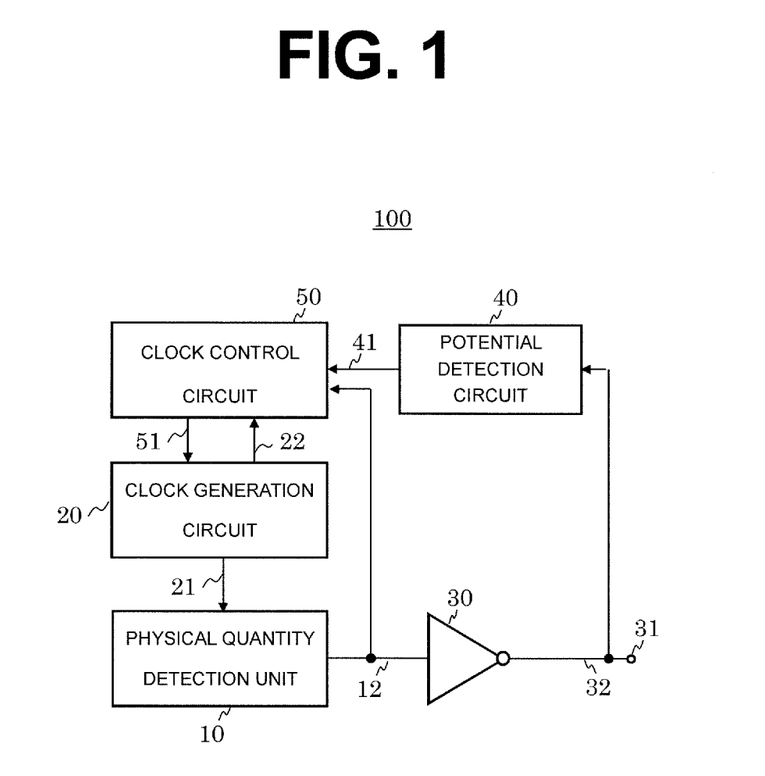
FIG. 1 is a block diagram of a sensor circuit according to a first embodiment of the present invention.

FIG. 1 is a block diagram of a sensor circuit 100 according to a first embodiment of the present invention.

The sensor circuit 100 according to the first embodiment includes a physical quantity detection unit 10, a clock generation circuit 20, an output driver 30, a potential detection circuit 40, and a clock control circuit 50.

The physical quantity detection unit 10 is configured to output a physical quantity detection signal 12, which has one of two different potential levels that is determined by an applied physical quantity.

The output driver 30 has an input connected to an output of the physical quantity detection unit 10 and an output connected to an output terminal 31. The output driver 30 inverts the potential level of the physical quantity detection signal 12 from the physical quantity detection unit 10 and outputs an output logic signal 32 of the sensor circuit 100 to the output terminal 31.

The potential detection circuit 40 has an input connected to the output terminal 31, and is configured to output a potential detection signal 41, which has two values, based on the potential at the output terminal 31.

The clock generation circuit 20 outputs a control signal 21, which controls detection operation, to the physical quantity detection unit 10, and outputs a sampling signal 22 to the clock control circuit 50 in a sleep period.

The potential detection signal 41, the sampling signal 22, and the physical quantity detection signal 12 are input to the clock control circuit 50, and the clock control circuit 50 outputs a mode switching signal 51 to the clock generation circuit 20.

The physical quantity detection unit 10 is a magnetic switch configured to detect the magnetic field of a south pole or a north pole, and switches the potential level of the physical quantity detection signal 12 depending on the magnitude of an externally applied magnetic flux density. The physical quantity detection unit 10 executes intermittent drive that includes an active period for the operation of detecting a physical quantity or canceling the detection depending on the control signal 21 and a sleep period for cutting off most of an operating current of an internal circuit.

The clock control circuit 50 samples the potential detection signal 41 in synchronization with the sampling signal 22, and holds data obtained by the sampling in a shift register or a similar component. The clock control circuit 50 switches the level of the mode switching signal 51 to one that corresponds to a test mode when a given signal pattern (here, "LHHL" or "HLLH") is obtained from the potential detection signal 41. The clock control circuit 50 switches the level of the mode switching signal 51 to one that corresponds to a normal mode when the physical quantity detection signal 12 changes.

The physical quantity detection unit 10 is configured to perform, for example, the following operation.

The physical quantity detection unit 10 enters the active period when the control signal 21 is at the H level to compare an output voltage of a Hall element against a reference voltage, and enters the sleep period when the control signal 21 is at the L level. The physical quantity detection unit 10 outputs the physical quantity detection signal 12 that is at the L level when the applied magnetic flux density is less than a given value, and outputs the physical quantity detection signal 12 that is at the H level when the applied magnetic flux density is greater than the given value.

The output driver 30 is, for example, a CMOS driver. In the output driver 30, an Nch driver is turned off and a Pch driver is turned on to output the output logic signal 32 that is at the H level to the output terminal 31 when the applied physical quantity is small, for example, when the physical quantity detection signal 12 input to the output driver 30 is at the L level. When the applied physical quantity is large, for example, when the physical quantity detection signal 12 input to the output driver 30 is at the H level, the Nch driver is turned on and the Pch driver is turned off to output the output logic signal 32 that is at the L level to the output terminal 31.

The potential detection circuit 40 is built from, for example, a Schmitt trigger circuit and a comparator that includes a differential pair and a reference voltage circuit. The potential detection circuit 40 outputs the potential detection signal 41 that is at the H level when the potential at the output terminal 31 is the H level, and outputs the potential detection signal 41 that is at the L level when the potential at the output terminal 31 is the L level.

The operation of the sensor circuit 100 according to the first embodiment is described next.

Figure 2:
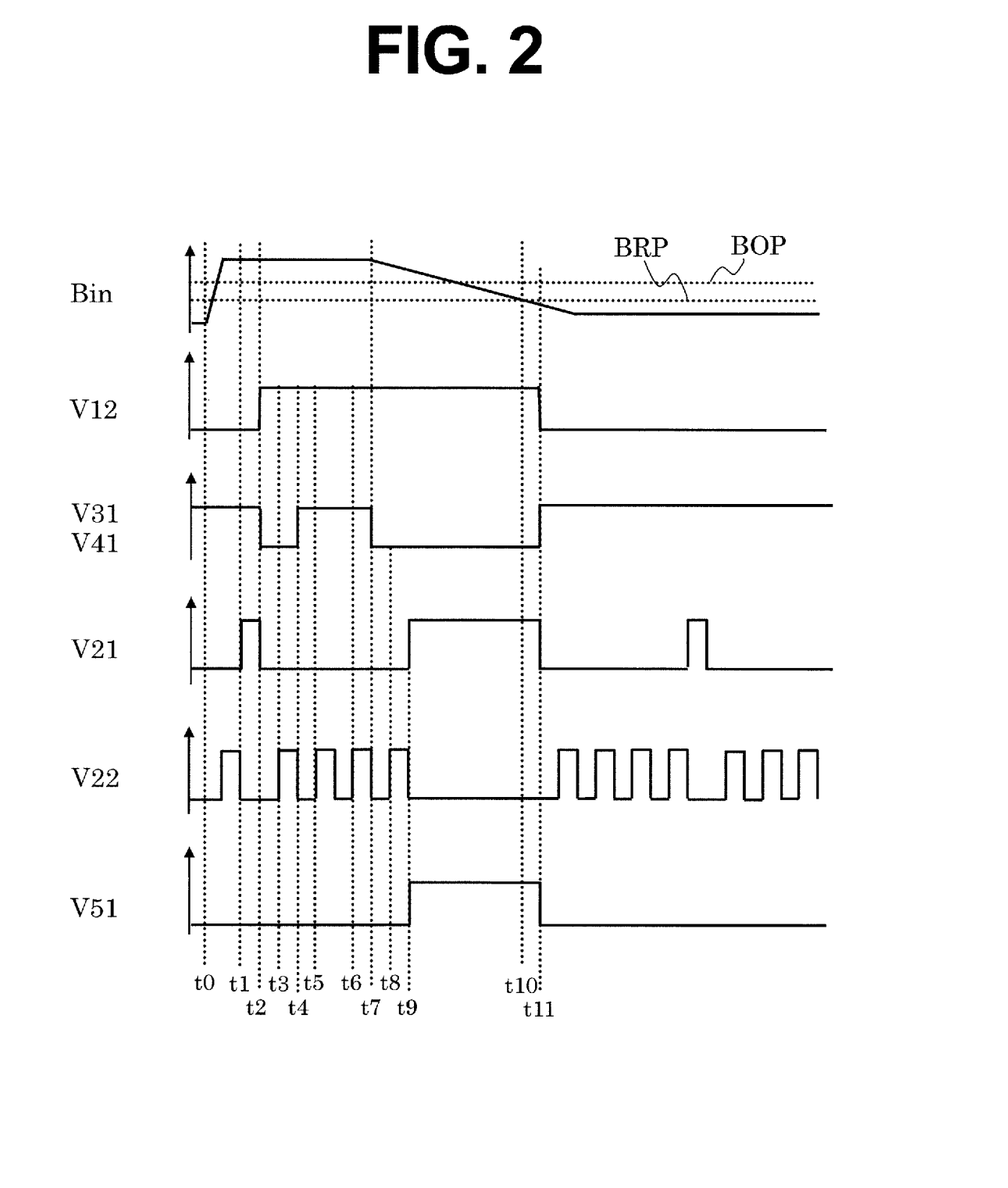
FIG. 2 is a timing chart for illustrating the operation of the sensor circuit according to the first embodiment.

FIG. 2 is a timing chart for illustrating the operation of the sensor circuit 100 according to the first embodiment.

In FIG. 2, Bin is the magnetic flux density applied to the sensor circuit 100, V12 is the voltage of the physical quantity detection signal 12, V31 is the voltage at the output terminal 31, V41 is the voltage of the potential detection signal 41, V21 is the voltage of the control signal 21, V22 is the voltage of the sampling signal 22, and V51 is the voltage of the mode switching signal 51. A threshold at which the physical quantity detection unit 10 detects a physical quantity is denoted by BOP, and a threshold at which the detection is canceled is denoted by BRP.

The magnetic flux density Bin illustrated in the timing chart is applied to the sensor circuit 100. The magnetic flux density Bin is below the threshold BRP before and at a time t0. Accordingly, the physical quantity detection signal 12 is at the L level, and the voltage at the output terminal 31 and the voltage of the potential detection signal 41 are at the H level.

The sensor circuit 100 is in the sleep period in normal operation until a time t1, and the sampling signal 22 is output from the clock generation circuit 20 while the mode switching signal 51 maintains the L level. The clock control circuit 50 keeps the potential detection signal 41 that is sampled by way of the sampling signal 22 prior to the time t1 at the H level, and normal operation (the mode switching signal 51 is at the L level) is accordingly maintained. The clock control circuit 50 reads the potential of the potential detection signal 41 at the rising edge of the sampling signal 22.

The sensor circuit 100 is in the active period in normal operation between the time t1 and a time t2, and the clock generation circuit 20 shifts the control signal 21 to the H level. The physical quantity detection unit 10 detects in the active period that the magnetic flux density Bin is above the threshold BOP and performs signal processing and, when the control signal 21 changes to the L level, shifts the physical quantity detection signal 12 to the H level. In response to the shift, the voltage at the output terminal 31 and the voltage of the potential detection signal 41 change to the L level. The sensor circuit 100 again enters the sleep period in normal operation, and the sampling signal 22 is output from the clock generation circuit 20 while the mode switching signal 51 maintains the L level.

The clock control circuit 50 reads the L level of the potential detection signal 41 at a time t3 by way of the sampling signal 22.

A voltage having the H level is forcedly input to the output terminal 31 from the outside from a time t4 to a time t7, and the clock control circuit 50 reads the H level of the potential detection signal 41 at a time t5 and a time t6 by way of the sampling signal 22. At a time t8, the clock control circuit 50 further reads the L level of the potential detection signal 41 by way of the sampling signal 22.

The signal level pattern of the input signal is accordingly "LHHL". The clock control circuit 50 in this case determines that the signal is a test mode input signal from the time t8 to a time t9, executes a switch from normal operation to the test mode, and outputs the mode switching signal 51 that is at the H level.

The sensor circuit 100 maintains the test mode until a time t10. The physical quantity detection signal 12 changes to the L level when the physical quantity detection unit 10 subsequently detects that the magnetic flux density Bin is equal to or less than the cancellation threshold BRP. In response to the change of the physical quantity detection signal 12 to the L level, the clock control circuit 50 executes a switch from the test mode to normal operation, and outputs the mode switching signal 51 that is at the L level.

As described above, in the sensor circuit 100 according to the first embodiment a voltage having a given signal pattern is forcedly input to the output terminal 31 from the outside in the sleep period in normal operation, in order to switch from normal operation to the test mode with the detection of the forcedly input voltage as a trigger. The test mode is then switched to normal operation in response to a change in level of the physical quantity detection signal 12. The sensor circuit 100 according to the first embodiment therefore has little possibility of accidentally switching to the test mode, and is capable of stable operation.

While a switch to the test mode is executed with the magnetic flux density Bin registered above the detection threshold BOP in the timing chart of FIG. 2, the same applies to the case in which the switch to the test mode is executed with the magnetic flux density Bin registered below the cancellation threshold BRP. In this case, the output terminal 31 is forcedly set to a potential at the L level to obtain a signal pattern "HLLH", which causes the clock control circuit 50 to determine that the signal is a test mode input signal, with the result that normal operation is switched to the test mode.

The signal pattern is not limited to "LHHL" and "HLLH" used in the description given above, and a more complicated signal pattern or a shorter signal pattern may be used.

Second Embodiment

Figure 3:
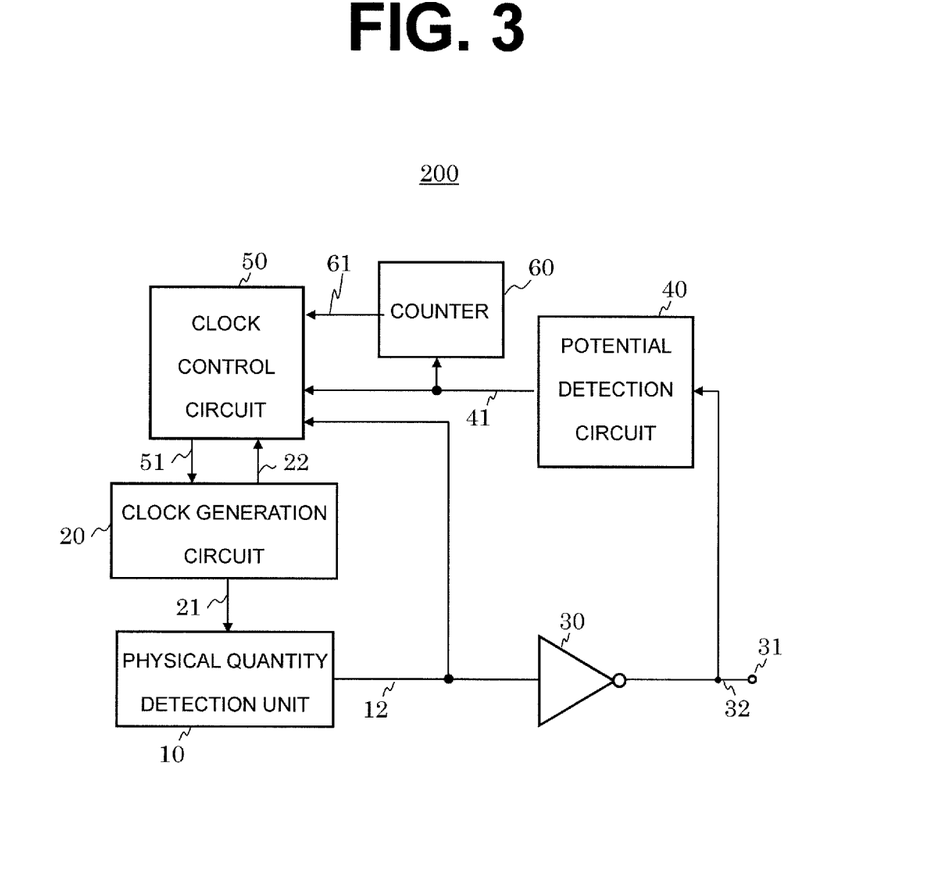
FIG. 3 is a block diagram of a sensor circuit according to a second embodiment of the present invention.

FIG. 3 is a block diagram of a sensor circuit 200 according to a second embodiment of the present invention. The sensor circuit 200 according to the second embodiment includes a counter 60 configured to count a timeout period, in addition to the components of the sensor circuit 100 of FIG. 1. The clock control circuit 50 in the second embodiment is configured to receive a timeout signal 61, which is output from the counter 60. The rest of the configuration of the sensor circuit 200 is the same as that of the sensor circuit 100 of FIG. 1, and the same components are denoted by the same reference symbols in order to omit descriptions on the components.

The potential detection signal 41 output from the potential detection circuit 40 is input to the counter 60, and the counter 60 outputs the timeout signal 61 to the clock control circuit 50. The clock control circuit 50 masks the sampling signal 22 when the received timeout signal 61 is at the H level.

The operation of the sensor circuit 200 according to the second embodiment is described next.

Figure 4:
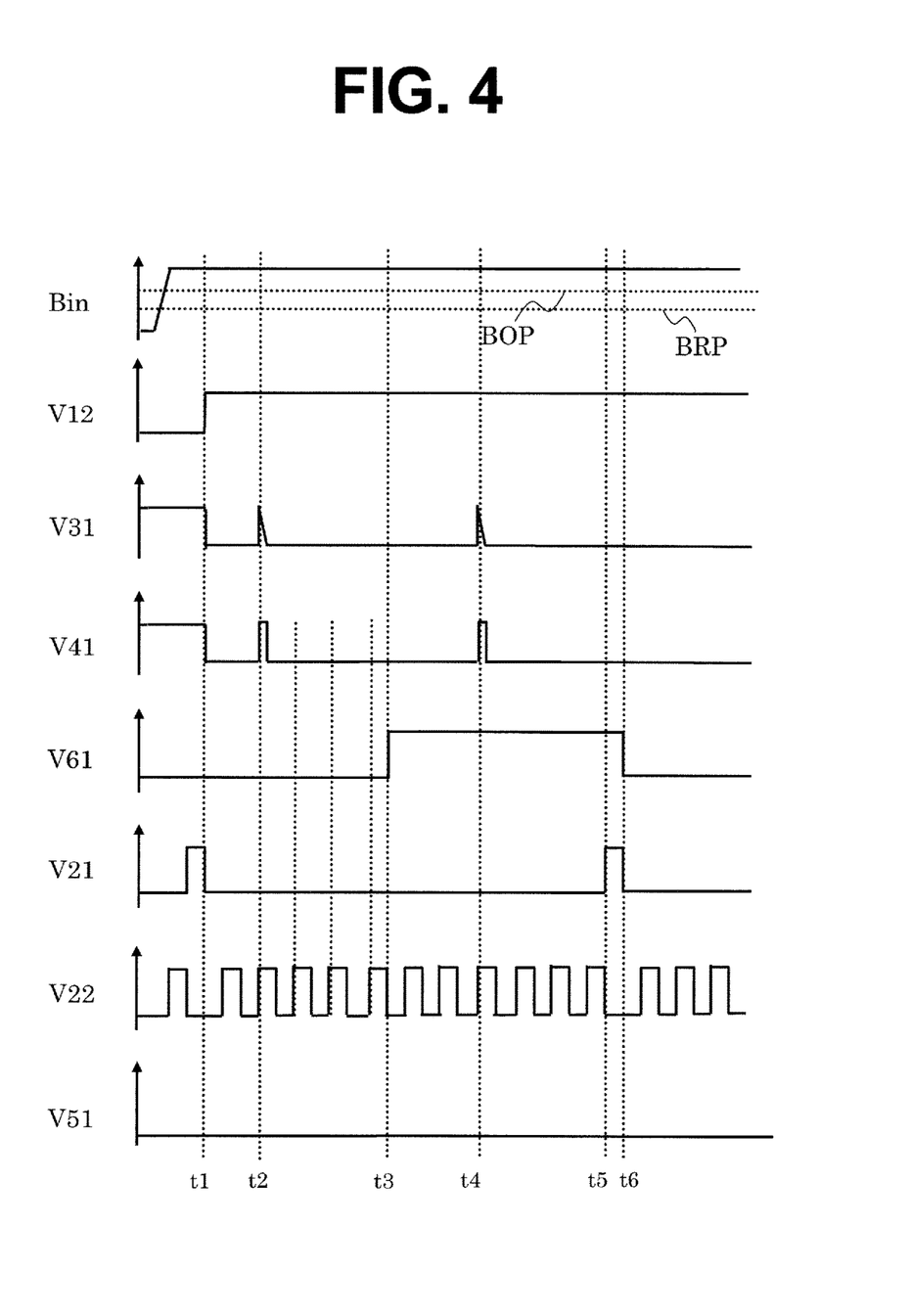
FIG. 4 is a timing chart for illustrating the operation of the sensor circuit according to the second embodiment.

FIG. 4 is a timing chart for illustrating the operation of the sensor circuit 200 according to the second embodiment.

In FIG. 4, the voltage of the timeout signal 61 is denoted by V61. A description on operation that is the same as in the timing chart of FIG. 2 is omitted.

At the time t1, the physical quantity detection signal 12 changes to the H level and the voltage at the output terminal 31 changes to the L level.

At the time t2, external noise superimposed on the voltage V31 at the output terminal 31 causes the voltage V31 to change as illustrated in FIG. 4, and the potential detection signal 41 that is at the H level is output. The clock control circuit 50 accordingly reads the H level of the potential detection signal 41 by way of the sampling signal 22.

The counter 60 starts counting in response to the change of the potential detection signal 41. When the timeout period is reached at the time t3, the counter 60 shifts the timeout signal 61 from the L level to the H level. The clock control circuit 50, which masks the sampling signal 22 when receiving the timeout signal 61 that is at the H level, does not read the potential detection signal 41 at the time t4 that is at the H level due to external noise.

The clock control circuit 50 accordingly does not recognize the signal pattern from the time t2 on as "HLLH", and therefore does not accidentally execute a switch to the test mode despite the presence of noise as in FIG. 4.

As described above, the sensor circuit according to the second embodiment includes the counter 60 configured to output the timeout signal 61, and is therefore even more successful at preventing the malfunction in which a switch to the test mode is executed accidentally.

The counter 60 may be built from a digital circuit that uses a flip-flop logic circuit, or from an analog clock circuit that uses a constant current source and a capacitive element. The timeout signal 61 may be reset to the L level from the H level by the control signal 21 at the time t5 or t6, for example.

Third Embodiment

Figure 5:
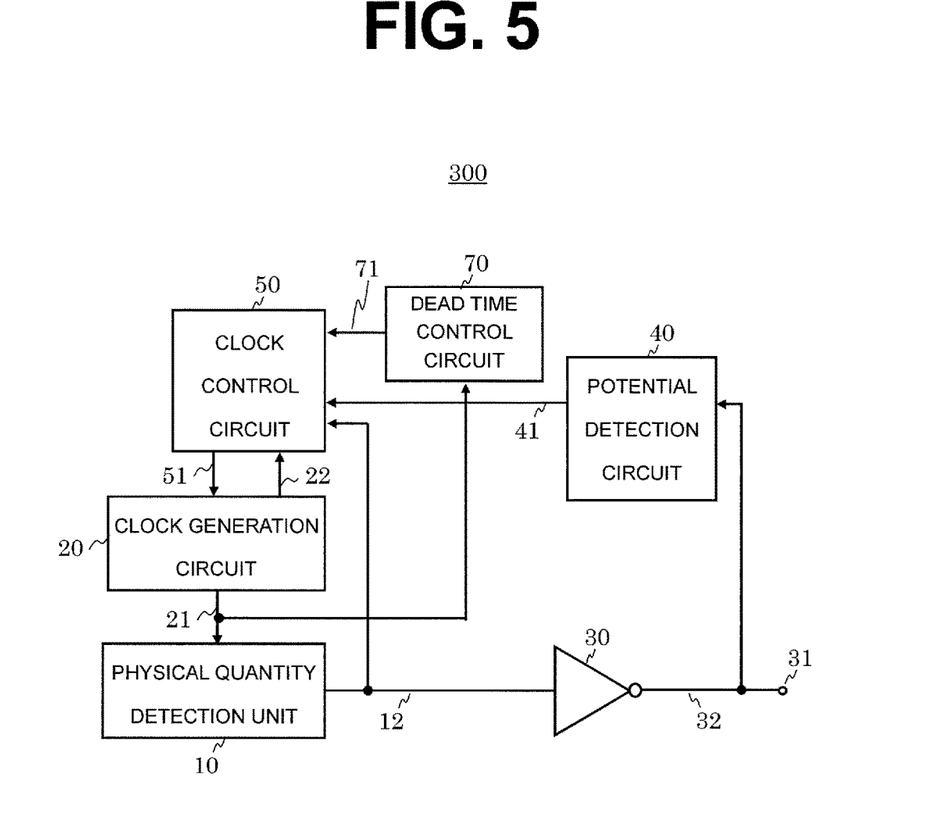
FIG. 5 is a block diagram of a sensor circuit according to a third embodiment of the present invention.

FIG. 5 is a block diagram of a sensor circuit 300 according to a third embodiment of the present invention. The sensor circuit 300 according to the third embodiment includes a dead time control circuit 70 configured to output a dead time signal 71 in response to the control signal 21, in addition to the components of the sensor circuit 100 of FIG. 1. The clock control circuit 50 in the third embodiment is configured to receive the dead time signal 71 output from the dead time control circuit 70. The rest of the configuration of the sensor circuit 300 is the same as that of the sensor circuit 100 of FIG. 1, and the same components are denoted by the same reference symbols in order to omit descriptions on the components.

The potential detection signal 41 is input to the dead time control circuit 70, and the dead time control circuit 70 outputs the dead time signal 71 to the clock control circuit 50. The clock control circuit 50 masks the sampling signal 22 when the received dead time signal 71 is at the H level.

The operation of the sensor circuit 300 according to the third embodiment is described next.

Figure 6:
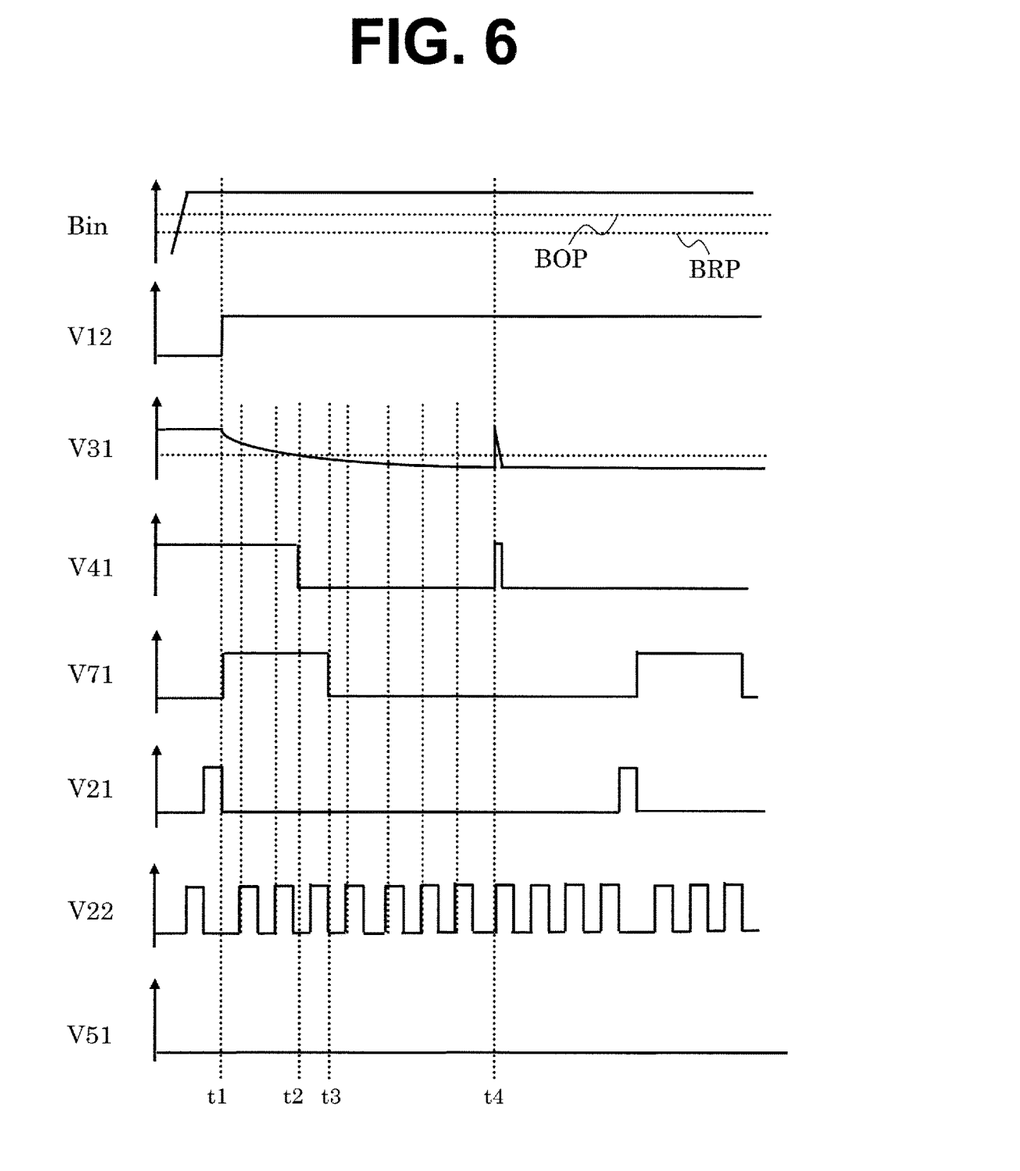
FIG. 6 is a timing chart for illustrating the operation of the sensor circuit according to the third embodiment.

FIG. 6 is a timing chart for illustrating the operation of the sensor circuit 300 according to the third embodiment.

In FIG. 6, the voltage of the dead time signal 71 is denoted by V71. A description on operation that is the same as in the timing chart of FIG. 2 is omitted.

At the time t1, the physical quantity detection signal 12 changes to the H level, and the output driver 30 sets its output to the L level. When the output terminal 31 is large in capacitive load, the voltage V31 at the output terminal 31 takes a relatively long time to stabilize statically that is calculated with the use of a time constant determined from the capacitive load of the output terminal 31 and from the ON resistance of the output driver 30.

The dead time control circuit 70 outputs the dead time signal 71 that is at the H level in response to the change of the control signal 21 to the H level, in other words, for a given period after the transition to the sleep period. The clock control circuit 50 masks the sampling signal 22 and does not perform sampling operation in the period leading to the time t3 during which the dead time signal 71 maintains the H level. The clock control circuit 50 accordingly does not read the H level of the potential detection signal 41 from the time t1 to the time t3.

At the time t2, the voltage V31 at the output terminal 31 drops below a determination threshold Vth of the potential detection circuit 40, which sets the potential detection signal 41 to the L level. It is therefore sufficient if the length of time in which the dead time signal 71 maintains the H level is longer than the length of time in which the voltage V31 is below the determination threshold Vth.

The clock control circuit 50 accordingly does not recognize the signal pattern from the time t1 on as "HLLH", and therefore does not accidentally execute a switch to the test mode despite the superimposition of noise at the output terminal 31 at the time t4.

According to the third embodiment, the sensor circuit 300 including the dead time control circuit 70 configured to output the dead time signal 71 to the clock control circuit 50 is thus even more successful at preventing the malfunction in which a switch to the test mode is executed accidentally.

The dead time control circuit 70 may be built from a flip-flop logic circuit, or from a clock circuit that uses a constant current source, a capacitive element, and a threshold circuit.

The dead time signal 71, which changes to the H level in response to the change of the control signal 21 to the H level in the description given above, may use any signal as a trigger for the change to the H level as long as the choice is in line with the spirit of the present invention.

Fourth Embodiment

Figure 7:
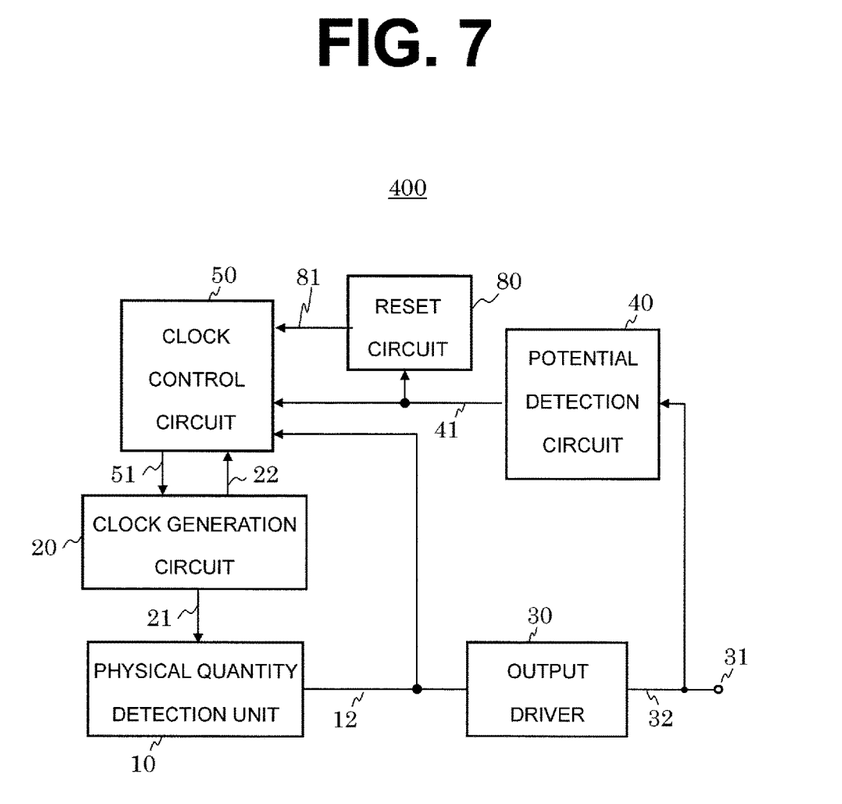
FIG. 7 is a block diagram of a sensor circuit according to a fourth embodiment of the present invention.

FIG. 7 is a block diagram of a sensor circuit 400 according to a fourth embodiment of the present invention. The sensor circuit 400 according to the fourth embodiment includes a reset circuit 80 configured to output a reset signal 81, in addition to the components of the sensor circuit 100 of FIG. 1. The clock control circuit 50 in the fourth embodiment is configured to receive the reset signal 81 output from the reset circuit 80. The rest of the configuration of the sensor circuit 400 is the same as that of the sensor circuit 100 of FIG. 1, and the same components are denoted by the same reference symbols in order to omit descriptions on the components.

The potential detection signal 41 is input to the reset circuit 80, and the reset circuit 80 outputs the reset signal 81 to the clock control circuit 50. The clock control circuit 50 resets the shift register, which keeps the signal pattern, when the received reset signal 81 is at the H level.

The operation of the sensor circuit 400 according to the fourth embodiment is described next.

Figure 8:
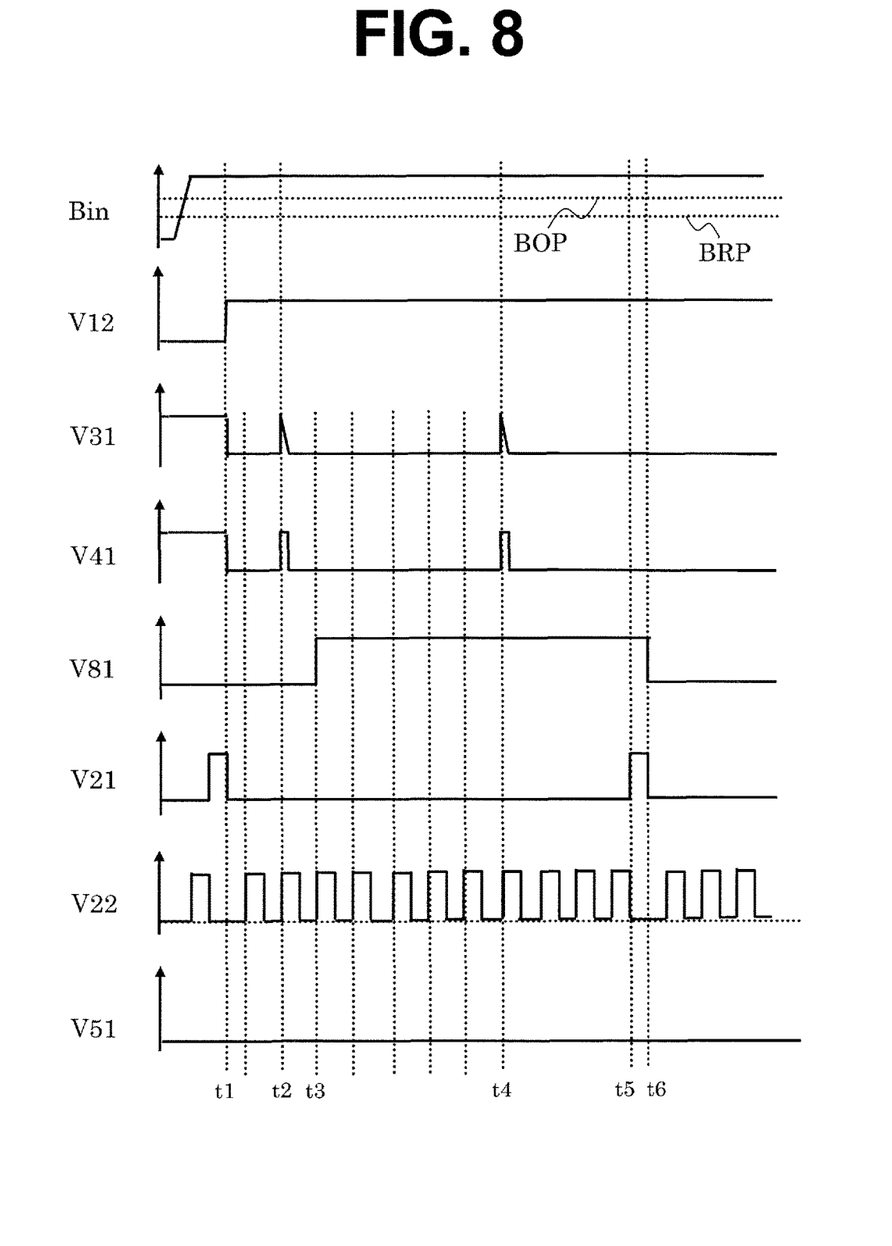
FIG. 8 is a timing chart for illustrating the operation of the sensor circuit according to the fourth embodiment.

FIG. 8 is a timing chart for illustrating the operation of the sensor circuit 400 according to the fourth embodiment.

In FIG. 8, the voltage of the reset signal 81 is denoted by V81. A description on operation that is the same as in the timing chart of FIG. 2 is omitted.

At the time t1, the physical quantity detection signal 12 changes to the H level, and the output driver 30 sets its output to the L level. The reset signal 81 is reset to the L level when the sleep period arrives.

At the time t2, external noise superimposed on the voltage V31 at the output terminal 31 causes the voltage V31 to change as illustrated in FIG. 8, and the potential detection signal 41 that is at the H level is output. The clock control circuit 50 accordingly reads the H level of the potential detection signal 41 by way of the sampling signal 22.

The reset circuit 80 has a function of detecting the signal width of the potential detection signal 41. For example, when the smallness of the width of the potential detection signal 41 at the time t2 in FIG. 8 is detected, the reset signal 81 that is at the H level is output to the clock control circuit 50 at the time t3. The clock control circuit 50 receives the reset signal 81 that is at the H level, and accordingly resets the shift register in which the signal pattern is held. In other words, the H level read into the shift register at the time t2 is reset.

This eliminates the possibility for the clock control circuit 50 to recognize the pattern of the potential detection signal 41 erroneously as "HLLH", despite the superimposition of external noise at the output terminal 31.

The sensor circuit 400 according to the fourth embodiment, which includes the reset circuit 80 configured to output the reset signal 81 to the clock control circuit 50, is thus even more successful at preventing the malfunction in which a switch to the test mode is executed accidentally.

While the reset signal 81 in FIG. 8 changes to the L level in response to the change of the control signal 21 to the H level, a one-shot pulse, for example, may be used instead.

As understood from the description given above, the sensor circuit according to the present invention can successfully prevent the malfunction in which a switch to the test mode is made accidentally. Because the clock control circuit 50, configured to sample the potential detection signal 41 in synchronization with the sampling signal 22, and the clock generation circuit 20, configured to output the sampling signal 22 in the sleep period, are equipped.

The physical quantity detection unit 10, which is described as a magnetic sensor circuit in the embodiments, is not limited thereto as long as the physical quantity detection unit 10 has a configuration that allows the output terminal 31 to output the result of detecting a physical quantity as a binary signal. For example, the physical quantity detection unit 10 may be a temperature sensor circuit or a light sensor circuit.

The sensor circuit according to the present invention is not necessarily limited to this configuration or sensor elements, and can be modified or combined in various ways without departing from the spirit of the present invention. For example, the circuits of the embodiments may be combined suitably. The present invention may also employ a configuration in which a voltage is forcedly applied to each output terminal in a plurality of combinations of the physical quantity detection unit 10, the output terminal 31, and the clock control circuit 50, and a switch to the test mode is executed depending on the combination.

What is claimed is:

1. A sensor circuit configured to perform intermittent operation that includes an active period and a sleep period, comprising:
    a physical quantity detection unit configured to output a physical quantity detection signal that has one of two different potential levels depending on an applied physical quantity;
    an output driver configured to output a logic signal to an output terminal in response to the physical quantity detection signal;
    a clock generation circuit configured to output a control signal that is used to control the intermittent operation to the physical quantity detection unit, and configured to output a sampling signal in the sleep period;
    a potential detection circuit configured to detect a potential at the output terminal, and to output a detection signal; and
    a clock control circuit configured to receive an input of the sampling signal and an input of the detection signal, and configured to output a mode switching signal to the clock generation circuit, the mode switching signal being a command to switch the clock generation circuit to a test mode when a given signal pattern is detected in data that is obtained by sampling the detection signal based on the sampling signal.

2. A sensor circuit according to claim 1;
    wherein the physical quantity detection signal output from the physical quantity detection unit is further input to the clock control circuit, and
    wherein the clock control circuit is configured to output the mode switching signal that is a command to switch to a normal mode, when the physical quantity detection signal changes in the test mode.

3. A sensor circuit according to claim 1, further comprising a counter configured to start counting in response to a change of the detection signal, and configured to output a timeout signal to the clock control circuit when a timeout period is reached, and wherein the clock control circuit is configured to mask the sampling signal by using the timeout signal.

4. A sensor circuit according to claim 1, further comprising a dead time control circuit configured to output a dead time signal to the clock control circuit for a given period after transition to the sleep period, and wherein the clock control circuit is configured to mask the sampling signal by using the dead time signal.

5. A sensor circuit according to claim 1, further comprising a reset circuit configured to output a reset signal to the clock control circuit when detecting that the detection signal is narrow in width, and wherein the clock control circuit is configured to mask the sampling signal by using the reset signal.

* * * * *